US011024993B2

(12) United States Patent
Nakamura

(10) Patent No.: US 11,024,993 B2
(45) Date of Patent: Jun. 1, 2021

(54) CONNECTING METHOD, CONNECTING STRUCTURE AND CONNECTION TERMINAL ASSEMBLY

(71) Applicant: Japan Aviation Electronics Industry, Limited, Tokyo (JP)

(72) Inventor: Keisuke Nakamura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/803,192

(22) Filed: Feb. 27, 2020

(65) Prior Publication Data

US 2020/0366011 A1 Nov. 19, 2020

(30) Foreign Application Priority Data

May 17, 2019 (JP) .............................. JP2019-093314

(51) Int. Cl.
  *H01R 12/61* (2011.01)
  *H01R 12/68* (2011.01)
  (Continued)

(52) U.S. Cl.
  CPC ........... *H01R 12/616* (2013.01); *H01R 12/68* (2013.01); *H01R 12/771* (2013.01);
  (Continued)

(58) Field of Classification Search
  CPC .... H01R 12/592; H01R 12/616; H01R 12/68; H01R 12/771; H01R 12/777; H01R 13/502
  See application file for complete search history.

(56) References Cited

U.S. PATENT DOCUMENTS 5,003,673 A * 4/1991 Nysten ............... A44B 17/0005
                                                                    24/662
8,192,207 B2    6/2012 Iida
                         (Continued)

FOREIGN PATENT DOCUMENTS

JP         2018-156861 A     10/2018

OTHER PUBLICATIONS

Extended European Search Report issued in corresponding EP application No. EP 20 16 4339 dated Jul. 17, 2020.

*Primary Examiner* — Oscar C Jimenez
(74) *Attorney, Agent, or Firm* — Muncy, Geissler, Olds & Lowe, P.C.

(57) ABSTRACT

A connection terminal is placed with an opening end of a recessed portion of the connection terminal contacting a top of a flexible substrate, a linking conductive member is pushed from a bottom toward a top of the flexible substrate, whereby the linking conductive member projects inside the recessed portion through the opening end as catching a part of the flexible substrate, and the part of the flexible substrate is sandwiched between a pressing portion of the linking conductive member and a first inner portion in the recessed portion to allow the pressing portion to contact a conductive portion exposed on the bottom of the flexible substrate and allow a contact portion of the linking conductive member to contact a second inner portion in the recessed portion, whereby the connection terminal is electrically connected to the conductive portion of the flexible substrate via the linking conductive member.

11 Claims, 7 Drawing Sheets

(51) Int. Cl.
*H01R 12/77* (2011.01)
*H01R 13/502* (2006.01)
*H05K 1/02* (2006.01)

(52) U.S. Cl.
CPC ......... *H01R 12/777* (2013.01); *H01R 13/502* (2013.01); *H05K 1/02* (2013.01); *H05K 2201/0332* (2013.01)

(56) References Cited

U.S. PATENT DOCUMENTS

| | | | |
|---|---|---|---|
| 10,868,380 B1 * | 12/2020 | Komoto | H01R 12/592 |
| 10,886,650 B1 * | 1/2021 | Komoto | H01R 12/778 |
| 2017/0112200 A1 | 4/2017 | Mason et al. | |
| 2017/0279230 A1 | 9/2017 | Komoto et al. | |
| 2018/0233854 A1 * | 8/2018 | Komoto | H01R 12/58 |
| 2018/0269606 A1 * | 9/2018 | Nakamura | H01R 12/777 |

* cited by examiner

CONNECTING METHOD, CONNECTING STRUCTURE AND CONNECTION TERMINAL ASSEMBLY

BACKGROUND OF THE INVENTION

The present invention relates to a connecting method, particularly to a method of electrically connecting a connection terminal disposed on the top surface of a flexible substrate to a conductive portion exposed on the bottom surface of the flexible substrate.

The present invention also relates to a connecting structure and a connection terminal assembly.

As a structure for connecting a connection terminal to a conductive portion of a flexible substrate, for example, JP 2018-156861 A discloses a connector 1 as shown in FIG. 19. The connector 1 includes a housing 3 disposed on the top surface of a flexible substrate 2, a connection terminal 4 projecting perpendicularly to the flexible substrate 2, and a base member 5 disposed on the bottom side of the flexible substrate 2. The housing 3 is provided with a connection terminal-receiving through-hole 3A, and the base member 5 is provided with a projection 5A. A blade member 6 held by the base member 5 protrudes from the top of the projection 5A.

With a tubular portion 4A of the connection terminal 4 being inserted in the connection terminal-receiving through-hole 3A of the housing 3 and the flexible substrate 2 being sandwiched between the housing 3 and the base member 5, when the housing 3 and the base member 5 are pushed to approach each other, the flexible substrate 2 is cut with the blade member 6 protruding from the top of the projection 5A of the base member 5, and further the projection 5A protrudes through the cut place toward the top surface side of the flexible substrate 2 and is inserted into a projection accommodating portion 4B formed in the tubular portion 4A of the connection terminal 4.

As a result, a cut end portion 2A of the flexible substrate 2 is sandwiched between the outer surface of the projection 5A of the base member 5 and the inner surface of the projection accommodating portion 4B of the connection terminal 4, whereby a flexible conductor 2B exposed on the top surface of the flexible substrate 2 and the connection terminal 4 are electrically connected to each other.

Thus, the flexible conductor 2B exposed on the top surface of the flexible substrate 2 and the connection terminal 4 can be electrically connected to each other owing to the use of the connector 1 of JP 2018-156861 A. However, when the flexible conductor 2B is exposed on the bottom surface of the flexible substrate 2, the connector 1 of JP 2018-156861 A is useless for electrically connecting the flexible conductor 2B to the connection terminal 4, disadvantageously.

SUMMARY OF THE INVENTION

The present invention has been made to overcome the conventional problem as above and aims at providing a connecting method that makes it possible to electrically connect a connection terminal disposed on the top surface of a flexible substrate to a conductive portion exposed on the bottom surface of the flexible substrate.

The present invention also aims at providing a connecting structure obtained using the connecting method, as well as a connection terminal assembly for use in the connecting method.

A connecting method according to the present invention is a method of electrically connecting a conductive connection terminal disposed on a top surface of a flexible substrate and including a recessed portion to a conductive portion exposed on a bottom surface of the flexible substrate, the method comprising:

placing the connection terminal in such a manner that an opening end of the recessed portion of the connection terminal is in contact with the top surface of the flexible substrate;

pushing a linking conductive member from a side of the bottom surface of the flexible substrate toward a side of the top surface of the flexible substrate on which the connection terminal is disposed, whereby the linking conductive member projects inside the recessed portion through the opening end of the recessed portion of the connection terminal as catching a part of the flexible substrate; and holding the part of the flexible substrate such that the part is sandwiched between a pressing portion of the linking conductive member and a first inner portion in the recessed portion of the connection terminal to thereby allow the pressing portion of the linking conductive member to make contact with the conductive portion exposed on the bottom surface of the flexible substrate and allow a contact portion of the linking conductive member to make contact with a second inner portion in the recessed portion of the connection terminal, whereby the connection terminal is electrically connected to the conductive portion of the flexible substrate via the linking conductive member.

A connecting structure according to the present invention is a structure in which a conductive connection terminal disposed on a top surface of a flexible substrate and including a recessed portion is electrically connected to a conductive portion exposed on a bottom surface of the flexible substrate, the structure comprising:

a linking conductive member including a pressing portion and a contact portion, wherein the connection terminal has a first inner portion and a second inner portion in the recessed portion, wherein with the connection terminal being disposed in such a manner that an opening end of the recessed portion of the connection terminal is in contact with the top surface of the flexible substrate, the linking conductive member projects inside the recessed portion from the side of the bottom surface of the flexible substrate through the opening end of the recessed portion of the connection terminal disposed on the top surface of the flexible substrate, and wherein a part of the flexible substrate is sandwiched between the pressing portion of the linking conductive member and the first inner portion of the connection terminal to thereby allow the pressing portion of the linking conductive member to make contact with the conductive portion exposed on the bottom surface of the flexible substrate and allow the contact portion of the linking conductive member to make contact with the second inner portion of the connection terminal, whereby the connection terminal is electrically connected to the conductive portion of the flexible substrate via the linking conductive member.

A connection terminal assembly according to the present invention comprising:

a conductive connection terminal disposed on a top surface of a flexible substrate and including a recessed portion; and a linking conductive member including a pressing portion and a contact portion, wherein the connection terminal has a first inner portion and a second inner portion in the recessed portion, wherein with the connection terminal being disposed in such a manner that an opening end of the recessed portion of the connection terminal is in contact with the top surface of the flexible substrate, the linking conductive member projects inside the recessed portion from a side of a bottom surface of the flexible substrate through the opening end of the recessed portion of the connection terminal disposed on the top surface of the flexible substrate, and wherein a part of the flexible substrate is sandwiched between the pressing portion of the linking conductive member and the first inner portion of the connection terminal to thereby allow the pressing portion of the linking conductive member to make contact with a conductive portion exposed on the bottom surface of the flexible substrate and allow the contact portion of the linking conductive member to make contact with the second inner portion of the connection terminal, whereby the connection terminal is electrically connected to the conductive portion of the flexible substrate via the linking conductive member.

DETAILED DESCRIPTION OF THE INVENTION

Embodiments of the present invention are described below based on the appended drawings.

Embodiment 1

Figure 1:
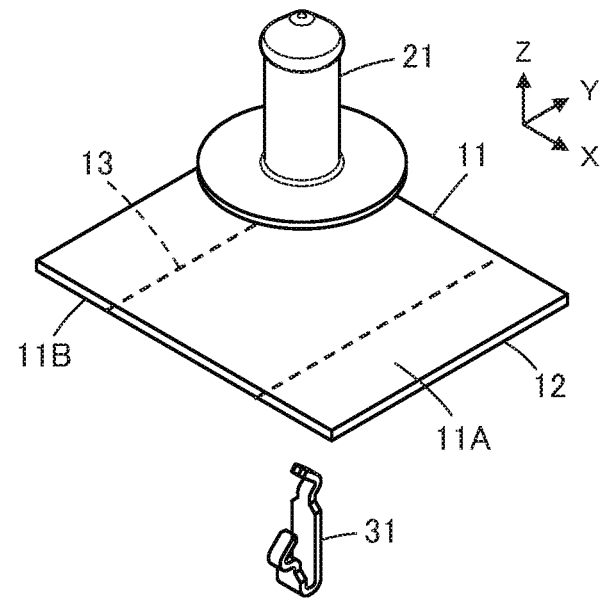
FIG. 1 is an exploded perspective view showing a connecting structure according to Embodiment 1.

As shown in FIG. 1, a connecting structure according to Embodiment 1 includes a flexible substrate 11, a connection terminal 21 and a linking conductive member 31. FIG. 1 shows the state before the connection terminal 21 is connected to the flexible substrate 11, where the connection terminal 21 is situated on the top surface 11A side of the flexible substrate 11, while the linking conductive member 31 is situated on the bottom surface 11B side of the flexible substrate 11.

Figure 2:
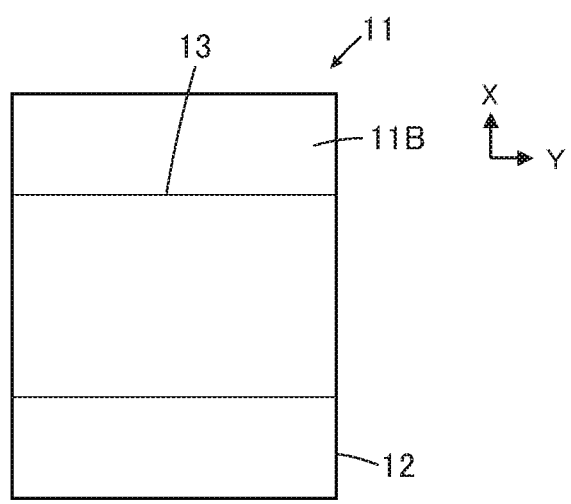
FIG. 2 is a bottom view showing the bottom surface of a flexible substrate used in the connecting structure according to Embodiment 1.

As shown in FIG. 2, the flexible substrate 11 includes an insulting substrate body 12 made of cloth, a resin film or another material, and a band shaped conductive portion 13 exposed on one surface of the substrate body 12. The conductive portion 13 is exposed on the bottom surface 11B of the flexible substrate 11 and not exposed on the top surface 11A side of the flexible substrate 11 as shown in FIG. 1.

The connecting structure according to Embodiment 1 serves to electrically connect the connection terminal 21 disposed on the top surface 11A of the flexible substrate 11 to the conductive portion 13 exposed on the bottom surface 11B of the flexible substrate 11.

For ease of understanding, a plane along which the flexible substrate 11 extends is called "XY plane," a direction in which the band shaped conductive portion 13 extends on the bottom surface 11B of the flexible substrate 11 "Y direction," and a direction extending perpendicularly to the flexible substrate 11 from the top surface 11A of the flexible substrate 11 "+Z direction."

Figure 3:
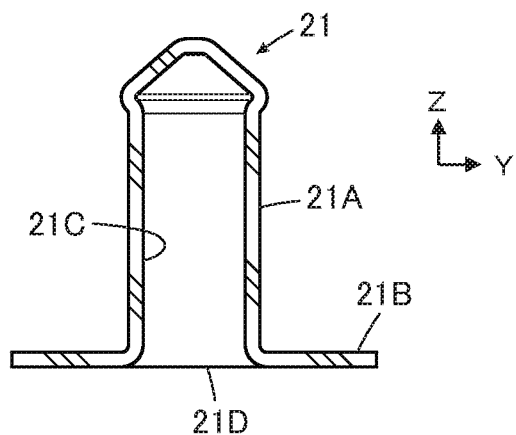
FIG. 3 is a cross-sectional view showing a connection terminal used in the connecting structure according to Embodiment 1.

As shown in FIG. 3, the connection terminal 21 is a plug-type terminal made of, for example, a metallic material and having conductivity and includes a tubular portion 21A of cylindrical shape that extends in the +Z direction and a flange 21B that is formed integrally with the −Z directional end of the tubular portion 21A and extends out of the tubular portion 21A along an XY plane.

The tubular portion 21A is provided in its interior with a recessed portion 21C opening in the −Z direction, and an opening end 21D of the recessed portion 21C is situated at the −Z directional end of the tubular portion 21A.

Figure 4:
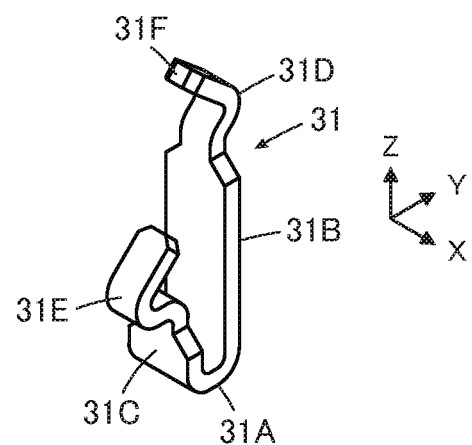
FIG. 4 is a perspective view showing a linking conductive member used in the connecting structure according to Embodiment 1.
Figure 5:
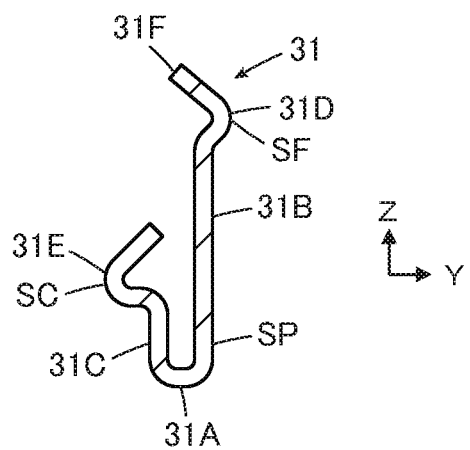
FIG. 5 is a cross-sectional view showing the linking conductive member used in the connecting structure according to Embodiment 1.

As shown in FIGS. 4 and 5, the linking conductive member 31 is formed from a band shaped metal sheet having conductivity and includes a bottom portion 31A bent in a U shape, a first arm 31B that extends in the +Z direction from the +Y directional end of the bottom portion 31A, and a second arm 31C that extends in the +Z direction from the −Y directional end of the bottom portion 31A in parallel to the first arm 31B and is shorter than the first arm 31B.

A first projecting portion 31D is formed near the +Z directional end of the first arm 31B so as to project in the +Y direction away from the second arm 31C, and a second projecting portion 31E is formed near the +Z directional end of the second arm 31C so as to project in the −Y direction away from the first arm 31B.

The linking conductive member 31 has a fulcrum portion SF formed from the first projecting portion 31D, a contact portion SC formed from the second projecting portion 31E, and a pressing portion SP formed from a part of the first arm 31B between the bottom portion 31A and the first projecting portion 31D.

The +Z directional end of the first arm 31B is provided with a sharp portion 31F pointed in the +Z direction.

While the linking conductive member 31 is sized to be accommodated in the tubular portion 21A of the connection terminal 21, the distance in the Y direction between the fulcrum portion SF and the contact portion SC is set slightly longer than the distance in the Y direction between those portions of the inner surface of the recessed portion 21C of the connection terminal 21 with which the fulcrum portion SF and the contact portion SC separately make contact. Accordingly, the linking conductive member 31 is accommodated in the recessed portion 21C formed in the tubular portion 21A of the connection terminal 21 while being elastically compressed in the Y direction.

Note that the connection terminal 21 and the linking conductive member 31 accommodated in the tubular portion 21A of the connection terminal 21 constitute a connection terminal assembly.

Next, a method of connecting the connection terminal 21 to the flexible substrate 11 is described.

Figure 6:
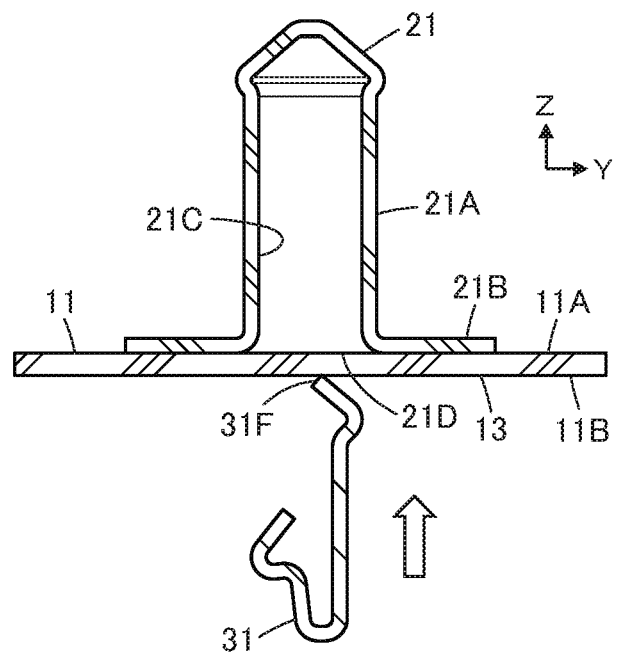
FIG. 6 is a cross-sectional view showing the linking conductive member being positioned with respect to the flexible substrate and the connection terminal in Embodiment 1.

First, as shown in FIG. 6, the connection terminal 21 is positioned with respect to the flexible substrate 11 in such a manner that the −Z directional surface of the flange 21B of the connection terminal 21 is in contact with the top surface 11A of the flexible substrate 11 and the connection terminal 21 corresponds in position to the conductive portion 13 disposed on the bottom surface 11B of the flexible substrate 11. The opening end 21D of the recessed portion 21C of the connection terminal 21 is also in contact with the top surface 11A of the flexible substrate 11, accordingly.

In addition, the linking conductive member 31 is positioned with respect to the flexible substrate 11 on the bottom surface 11B side of the flexible substrate 11 in such a manner that the sharp portion 31F of the linking conductive member 31 is situated immediately under the opening end 21D of the recessed portion 21C of the connection terminal 21. At this time, since the conductive portion 13 is exposed on the bottom surface 11B of the flexible substrate 11 in the position where the connection terminal 21 is disposed, the sharp portion 31F of the linking conductive member 31 faces the conductive portion 13.

Figure 7:
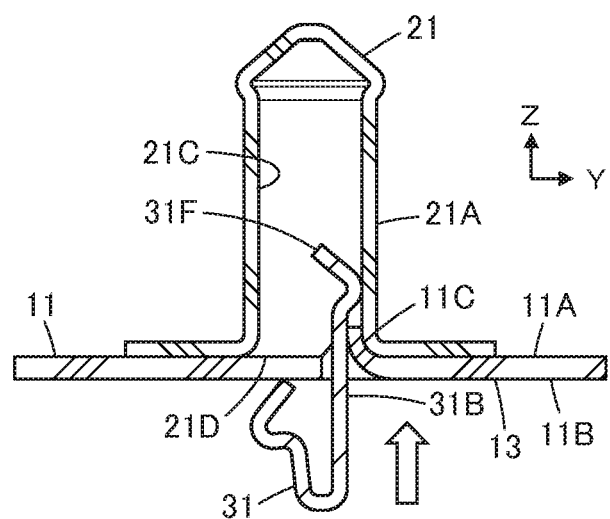
FIG. 7 is a cross-sectional view showing a state where a tip end of a first arm of the linking conductive member is inserted in a recessed portion of the connection terminal in Embodiment 1.

In this state, when the linking conductive member 31 is pushed from the bottom surface 11B side of the flexible substrate 11 toward the top surface 11A side thereof in the +Z direction, as shown in FIG. 7, the flexible substrate 11 situated immediately under the opening end 21D of the recessed portion 21C of the connection terminal 21 is cut with the sharp portion 31F of the linking conductive member 31, and the first arm 31B of the linking conductive member 31 enters the recessed portion 21C through the opening end 21D of the connection terminal 21 as catching a cut edge 11C of the flexible substrate 11.

Figure 8:
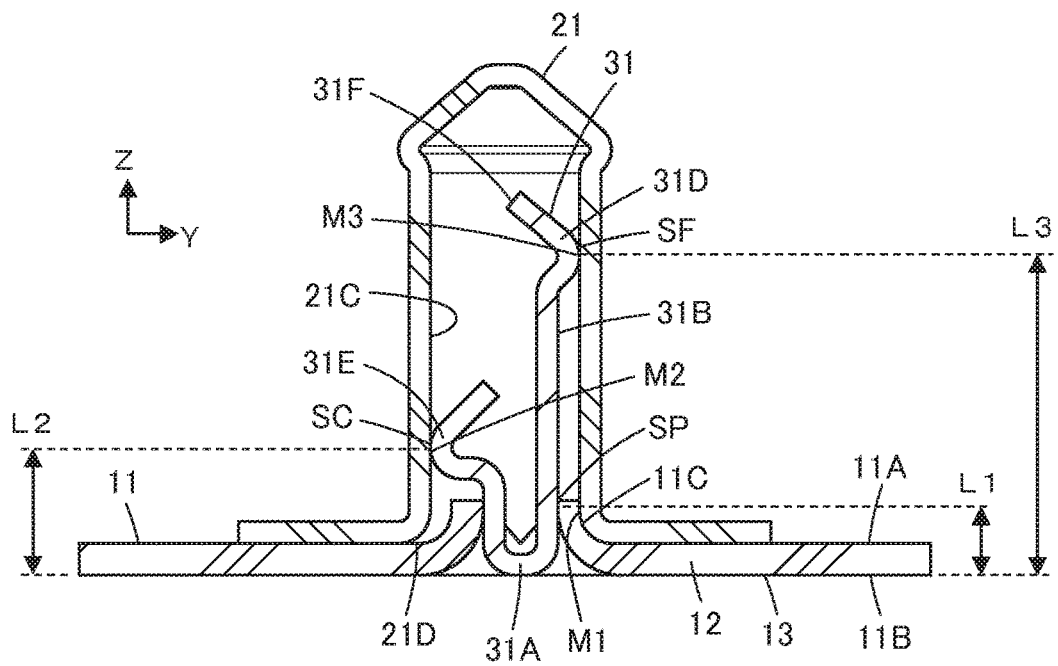
FIG. 8 is a cross-sectional view showing the connecting structure according to Embodiment 1.

When the linking conductive member 31 is further pushed toward the flexible substrate 11 in the +Z direction, as shown in FIG. 8, the linking conductive member 31 is almost entirely accommodated in the recessed portion 21C to project therein through the opening end 21D of the connection terminal 21. Since the distance in the Y direction between the fulcrum portion SF and the contact portion SC of the linking conductive member 31 is set slightly longer than the inner diameter of the recessed portion 21C of the connection terminal 21, the linking conductive member 31 is accommodated in the recessed portion 21C of the connection terminal 21 while being elastically compressed in the Y direction.

At this time, the cut edge 11C of the flexible substrate 11 formed upon cutting with the sharp portion 31F of the linking conductive member 31 is sandwiched between the pressing portion SP and a first inner portion M1, the pressing portion SP being formed from a part of the first arm 31B between the bottom portion 31A and the first projecting portion 31D of the linking conductive member 31, and the first inner portion M1 being a part of the inner surface of the recessed portion 21C of the connection terminal 21 near the opening end 21D and facing in the −Y direction. Since the conductive portion 13 is exposed on the bottom surface 11B of the flexible substrate 11, the conductive portion 13 exposed at the cut edge 11C makes contact with the pressing portion SP of the linking conductive member 31.

The substrate body 12 of the flexible substrate 11 at the cut edge 11C is sandwiched between the pressing portion SP of the linking conductive member 31 and the first inner portion M1 of the connection terminal 21 and thus elastically compressed in its thickness direction, whereby a given contact pressure is generated between the conductive portion 13 at the cut edge 11C and the pressing portion SP, so that the linking conductive member 31 is electrically connected to the conductive portion 13 of the flexible substrate 11.

Aside from that, when the linking conductive member 31 is almost entirely accommodated in the recessed portion 21C of the connection terminal 21, the contact portion SC formed from the second projecting portion 31E of the linking conductive member 31 projecting in the −Y direction makes contact with a second inner portion M2 which is another part of the inner surface of the recessed portion 21C of the connection terminal 21 and faces in the +Y direction. Since the linking conductive member 31 is accommodated in the recessed portion 21C of the connection terminal 21 while being elastically compressed in the Y direction, a given contact pressure is generated between the contact portion SC and the second inner portion M2, so that the linking conductive member 31 is electrically connected to the connection terminal 21.

Consequently, the connection terminal 21 is electrically connected to the conductive portion 13 of the flexible substrate 11 via the linking conductive member 31. This configuration makes it possible to electrically connect the connection terminal 21 disposed on the top surface 11A of the flexible substrate 11 to the conductive portion 13 exposed on the bottom surface 11B of the flexible substrate 11.

Furthermore, when the linking conductive member 31 is almost entirely accommodated in the recessed portion 21C of the connection terminal 21, as shown in FIG. 8, the fulcrum portion SF formed from the first projecting portion 31D of the linking conductive member 31 projecting in the +Y direction makes contact with a third inner portion M3 which is still another part of the inner surface of the recessed portion 21C of the connection terminal 21 and faces in the −Y direction.

The first inner portion M1, the second inner portion M2 and the third inner portion M3 are all defined on the inner peripheral surface of the tubular portion 21A of cylindrical shape, and the first inner portion M1 and the third inner portion M3 are opposed to the second inner portion M2.

In the configuration as above, a distance L1 from the bottom portion 31A of the linking conductive member 31 to the pressing portion SP, a distance L2 from the bottom portion 31A to the contact portion SC, and a distance L3 from the bottom portion 31A to the fulcrum portion SF have the relationship of L1<L2<L3. The pressing portion SP is a portion where the linking conductive member 31 presses the cut edge 11C of the flexible substrate 11 against the first inner portion M1 of the connection terminal 21. The linking conductive member 31 receives at the pressing portion SP a force acting in the −Y direction from the first inner portion M1 of the connection terminal 21 via the cut edge 11C of the flexible substrate 11 and also receives at the fulcrum portion SF a force acting in the −Y direction from the third inner portion M3 of the connection terminal 21, while receiving a force acting in the +Y direction from the second inner portion M2 of the connection terminal 21 at the contact portion SC whose height in the Z direction is between that of the pressing portion SP and that of the fulcrum portion SF. Thus, moments of the forces that the pressing portion SP, the contact portion SC and the fulcrum portion SF respectively receive from the first inner portion M1, the second inner portion M2 and the third inner portion M3 of the connection terminal 21 balance, so that the linking conductive member 31 is stably held inside the recessed portion 21C of the connection terminal 21.

Figure 9:
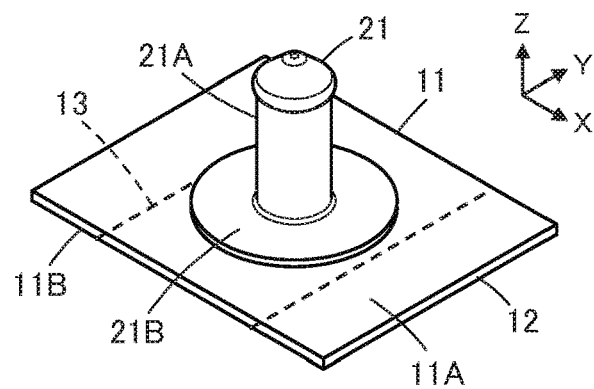
FIG. 9 is a perspective view showing the connecting structure according to Embodiment 1.

As described above, when the linking conductive member 31 is pushed from the bottom surface 11B side of the flexible substrate 11 into the recessed portion 21C of the connection terminal 21 to allow the linking conductive member 31 to be accommodated therein, as shown in FIG. 9, the connection terminal 21 disposed on the top surface 11A of the flexible substrate 11 is electrically connected to the conductive portion 13 exposed on the bottom surface 11B of the flexible substrate 11.

Figure 10:
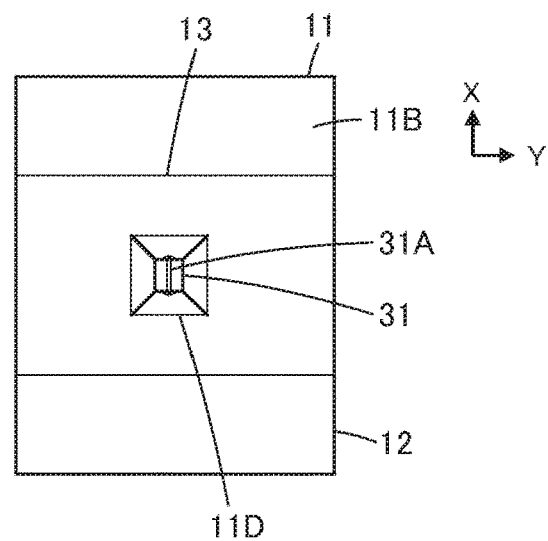
FIG. 10 is a bottom view showing the connecting structure according to Embodiment 1.

As shown in FIG. 10, upon pushing and inserting the linking conductive member 31, a cut portion 11D is formed in the bottom surface 11B of the flexible substrate 11 in the position where the conductive portion 13 is disposed, and the bottom portion 31A of the linking conductive member 31 is exposed through the cut portion 11D.

The connection terminal 21 connected to the flexible substrate 11 is a plug-type terminal having the tubular portion 21A of cylindrical shape extending in the +Z direction and can serve as a connector for connecting the conductive portion 13 of the flexible substrate 11 to an external device or circuit or the like. When a counter connector (not shown) is fitted with the connection terminal 21 and the tubular portion 21A is connected to a contact of the counter connector, the conductive portion 13 of the flexible substrate 11 is electrically connected to the contact of the counter connector via the tubular portion 21A of the connection terminal 21, accordingly.

The connection terminal 21 is desirably fixed on the top surface 11A of the flexible substrate 11 using the flange 21B. For instance, an unshown housing may be used to fix the connection terminal 21 to the flexible substrate 11 such that the −Z directional surface of the flange 21B of the connection terminal 21 is in contact with the top surface 11A of the flexible substrate 11.

Embodiment 2

Figure 11:
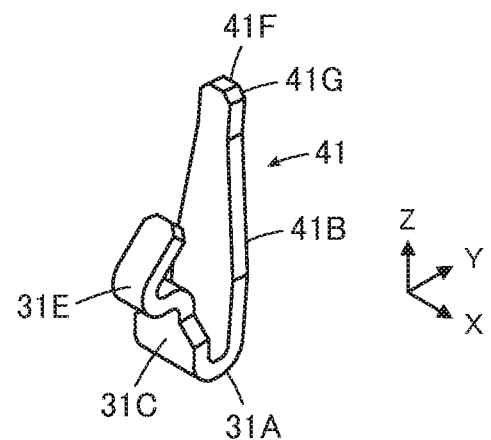
FIG. 11 is a perspective view showing a linking conductive member used in a connecting structure according to Embodiment 2.
Figure 12:
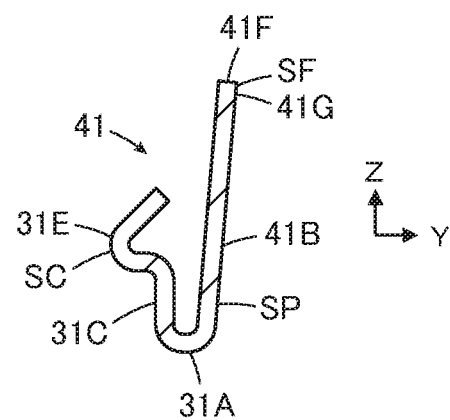
FIG. 12 is a cross-sectional view showing the linking conductive member used in the connecting structure according to Embodiment 2.

While in Embodiment 1 above, the first projecting portion 31D is formed near the +Z directional end of the first arm 31B of the linking conductive member 31 as shown in FIGS. 4 and 5, the invention is not limited thereto, and as shown in FIGS. 11 and 12, a linking conductive member 41 with no first projecting portion may be used.

The linking conductive member 41 is the same as the linking conductive member 31 used in Embodiment 1 except that the first arm 31B is replaced by a first arm 41B in Embodiment 1.

More specifically, the linking conductive member 41 is formed from a band shaped metal sheet having conductivity and includes a bottom portion 31A bent in a U shape, a first arm 41B that extends in the +Z direction from the +Y directional end of the bottom portion 31A, and a second arm 31C that extends in the +Z direction from the −Y directional end of the bottom portion 31A in parallel to the first arm 41B and is shorter than the first arm 41B.

A second projecting portion 31E is formed near the +Z directional end of the second arm 31C so as to project in the −Y direction away from the first arm 41B, while a first projecting portion projecting in the Y direction is not formed at the first arm 41B.

The linking conductive member 41 has a fulcrum portion SF formed from a +Z directional end 41G of the first arm 41B, a contact portion SC formed from the second projecting portion 31E, and a pressing portion SP formed from a part of the first arm 41B between the bottom portion 31A and the +Z directional end 41G of the first arm 41B.

The +Z directional end 41G of the first arm 41B is provided with a sharp portion 41F pointed in the +Z direction.

Figure 13:
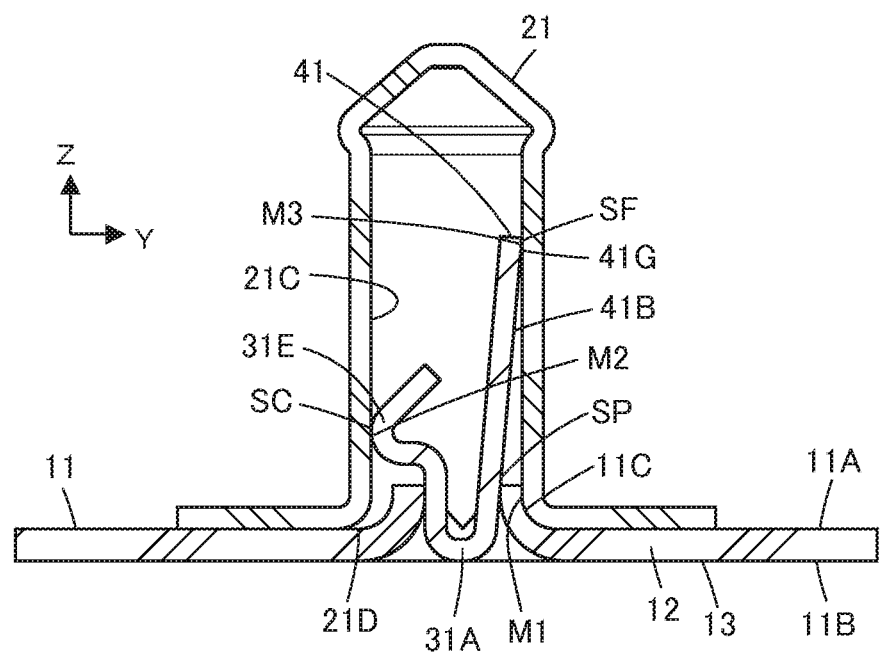
FIG. 13 is a cross-sectional view showing the connecting structure according to Embodiment 2.

As with the linking conductive member 31 in Embodiment 1, the linking conductive member 41 is pushed from the bottom surface 11B side of the flexible substrate 11 toward the top surface 11A side thereof, and as shown in FIG. 13, the linking conductive member 41 is almost entirely accommodated in the recessed portion 21C to project therein through the opening end 21D of the connection terminal 21.

At this time, the cut edge 11C of the flexible substrate 11 is sandwiched between the pressing portion SP formed from the first arm 41B of the linking conductive member 41 and the first inner portion M1 of the connection terminal 21 facing in the −Y direction, whereby the conductive portion 13 of the flexible substrate 11 at the cut edge 11C and the linking conductive member 41 are electrically connected to each other.

Further, the contact portion SC formed from the second projecting portion 31E of the linking conductive member 41 makes contact with the second inner portion M2 of the connection terminal 21 facing in the +Y direction whereby the linking conductive member 41 is electrically connected to the connection terminal 21, and consequently, the connection terminal 21 is electrically connected to the conductive portion 13 of the flexible substrate 11 via the linking conductive member 41.

In addition, the fulcrum portion SF formed from +Z directional end 41G of the linking conductive member 41 makes contact with the third inner portion M3 of the connection terminal 21 facing in the −Y direction. Moments of the forces that the pressing portion SP, the contact portion SC and the fulcrum portion SF respectively receive from the first inner portion M1, the second inner portion M2 and the third inner portion M3 of the connection terminal 21 balance, so that the linking conductive member 41 is stably held inside the recessed portion 21C of the connection terminal 21.

Thus, even with the linking conductive member 41 with no first projecting portion, the connection terminal 21 disposed on the top surface 11A of the flexible substrate 11 can be electrically connected to the conductive portion 13 exposed on the bottom surface 11B of the flexible substrate 11 as with Embodiment 1.

Embodiment 3

Figure 14:
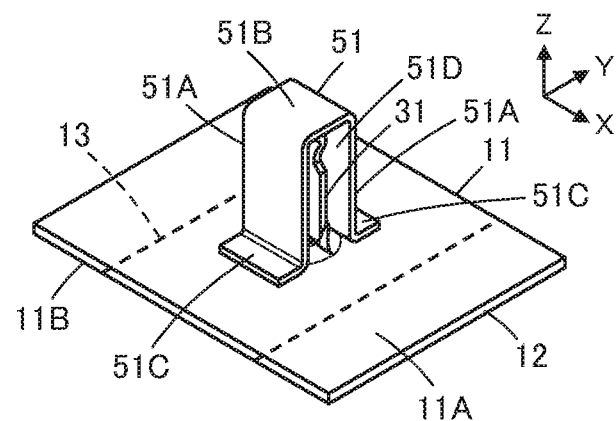
FIG. 14 is a perspective view showing a connecting structure according to Embodiment 3.

FIG. 14 shows a connecting structure according to Embodiment 3. This connecting structure is the same as the connecting structure according to Embodiment 1 except that the connection terminal 21 having the tubular portion 21A of cylindrical shape is replaced by a connection terminal 51 formed from a bent single metal sheet in the connecting structure of Embodiment 1.

The connection terminal 51 includes a pair of lateral sheets 51A extending along an XZ plane in parallel to each other, a top sheet 51B interconnecting the +Z directional ends of the lateral sheets 51A and extending along an XY plane, and a pair of flanges 51C extending from the −Z directional ends of the associated lateral sheets 51A in directions away from each other along an XY plane.

The pair of lateral sheets 51A and the top sheet 51B constitute a recessed portion 51D covered on the Y and Z direction sides. The X direction sides of the recessed portion 51D are not covered but open.

While the linking conductive member 31 is sized to be accommodated in the recessed portion 51D of the connection terminal 51, the distance in the Y direction between the fulcrum portion SF and the contact portion SC is set slightly longer than the distance in the Y direction between the inner surfaces of the recessed portion 51D of the connection terminal 51. Accordingly, the linking conductive member 31 is accommodated in the recessed portion 51D of the connection terminal 51 while being elastically compressed in the Y direction.

Figure 15:
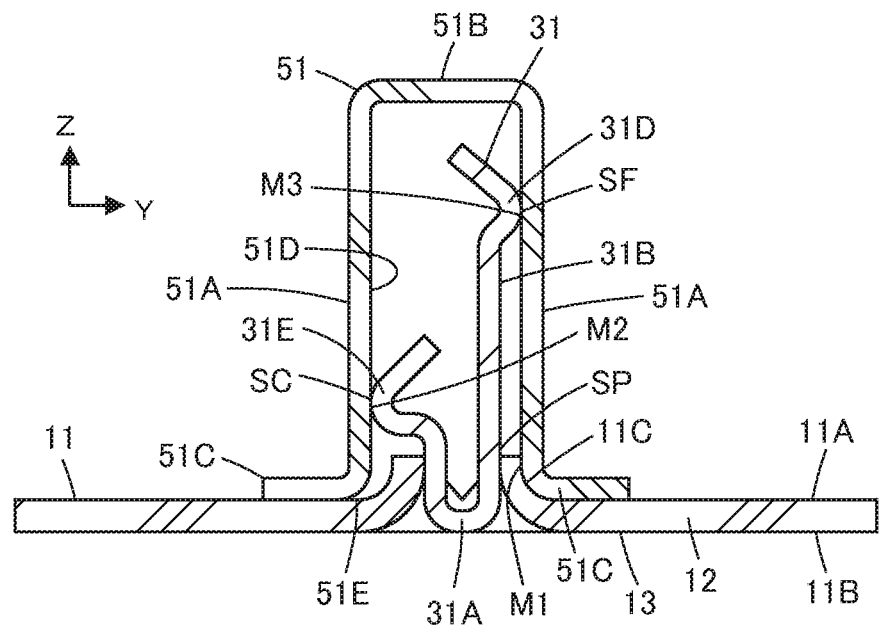
FIG. 15 is a cross-sectional view showing the connecting structure according to Embodiment 3.

As with the connecting structure of Embodiment 1, the linking conductive member 31 is pushed from the bottom surface 11B side of the flexible substrate 11 toward the top surface 11A side thereof, and as shown in FIG. 15, the linking conductive member 31 is almost entirely accommodated in the recessed portion 51D of the connection terminal 51 to project therein.

An opening end 51E of the recessed portion 51D is situated between the −Z directional ends of the lateral sheets 51A of the connection terminal 51, i.e., between the flanges 51C, and the linking conductive member 31 is inserted from the bottom surface 11B side of the flexible substrate 11 through this opening end 51E and accommodated in the recessed portion 51D.

The cut edge 11C of the flexible substrate 11 is sandwiched between the pressing portion SP formed from the first arm 31B of the linking conductive member 31 and the first inner portion M1 which is a part of one lateral sheet 51A on the +Y direction side of the pair of lateral sheets 51A of the connection terminal 51 and faces in the −Y direction, whereby the conductive portion 13 of the flexible substrate 11 at the cut edge 11C and the linking conductive member 31 are electrically connected to each other.

Further, the contact portion SC formed from the second projecting portion 31E of the linking conductive member 31 makes contact with the second inner portion M2 which is a part of the other lateral sheet 51A on the −Y direction side of the pair of lateral sheets 51A of the connection terminal 51 and faces in the +Y direction, whereby the linking conductive member 31 is electrically connected to the connection terminal 51. Consequently, the connection terminal 51 is electrically connected to the conductive portion 13 of the flexible substrate 11 via the linking conductive member 31.

In addition, the fulcrum portion SF formed from the first projecting portion 31D of the linking conductive member 31 makes contact with the third inner portion M3 which is a part of the one lateral sheet 51A on the +Y direction side of the pair of lateral sheets 51A of the connection terminal 51 and faces in the −Y direction. Moments of the forces that the pressing portion SP, the contact portion SC and the fulcrum portion SF respectively receive from the first inner portion M1, the second inner portion M2 and the third inner portion M3 of the connection terminal 51 balance, so that the linking conductive member 31 is stably held inside the recessed portion 51D of the connection terminal 51.

Thus, even with the connection terminal 51 formed from a bent single metal sheet, the connection terminal 51 disposed on the top surface 11A of the flexible substrate 11 can be electrically connected to the conductive portion 13 exposed on the bottom surface 11B of the flexible substrate 11 as with Embodiment 1.

The connection terminal 51 can be produced only by bending a single metal sheet, thus facilitating formation of the connecting structure.

The connection terminal 51 is fixed on the top surface 11A of the flexible substrate 11 by use of the pair of flanges 51C and, for instance, an unshown housing.

A similar connecting structure can also be formed by combining, instead of the linking conductive member 31, the linking conductive member 41 used in Embodiment 2 with the connection terminal 51.

Embodiment 4

Figure 16:
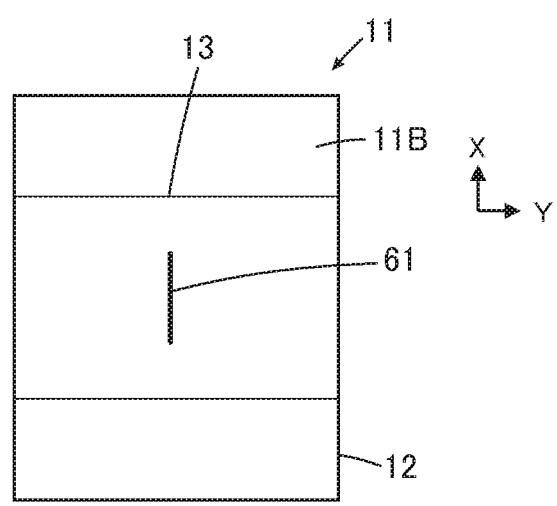
FIG. 16 is a bottom view showing the bottom surface of a flexible substrate used in the connecting structure according to Embodiment 4.

In Embodiment 1 above, when the linking conductive member 31 is pushed from the bottom surface 11B side of the flexible substrate 11 toward the top surface 11A side thereof, the flexible substrate 11 is cut with the sharp portion 31F of the linking conductive member 31 to allow the linking conductive member 31 to project in the recessed portion 21C of the connection terminal 21; however, as shown in FIG. 16, the flexible substrate 11 may be provided in advance with a pushing guide 61 penetrating from the top surface 11A through the bottom surface 11B.

The pushing guide 61 is constituted of a linear cut penetrating the flexible substrate 11 from the top surface 11A through the bottom surface 11B and formed in the flexible substrate 11 in the position where the opening end 21D of the connection terminal 21 is situated as shown in FIG. 8.

Since the linking conductive member 31 is pushed from the bottom surface 11B side of the flexible substrate 11 toward the top surface 11A side thereof through the pushing guide 61 thus formed, less pushing power is only required to make the linking conductive member 31 project inside the recessed portion 21C of the connection terminal 21. Further, the presence of the pushing guide 61 clarifies the position to receive the linking conductive member 31 pushed from the bottom surface 11B side of the flexible substrate 11, thus improving the operability in formation of the connecting structure.

Figure 17:
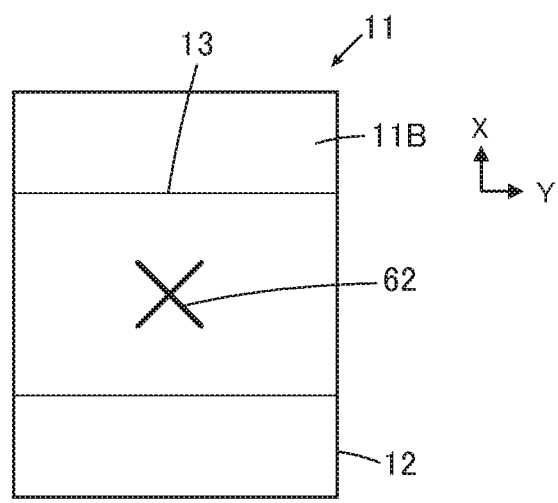
FIG. 17 is a bottom view showing the bottom surface of a flexible substrate used in a connecting structure according to a modification of Embodiment 4.
Figure 18:
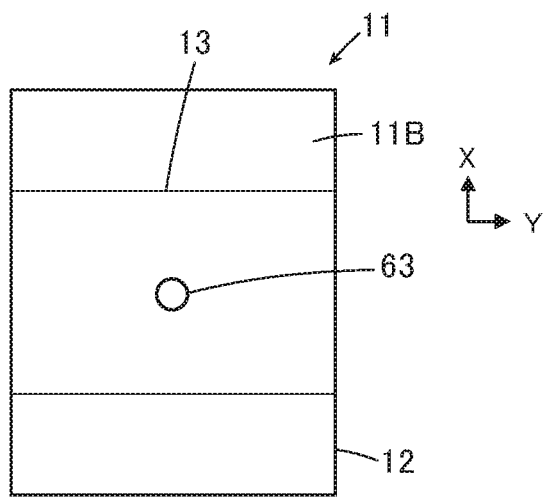
FIG. 18 is a bottom view showing the bottom surface of a flexible substrate used in a connecting structure according to another modification of Embodiment 4.
Figure 19:
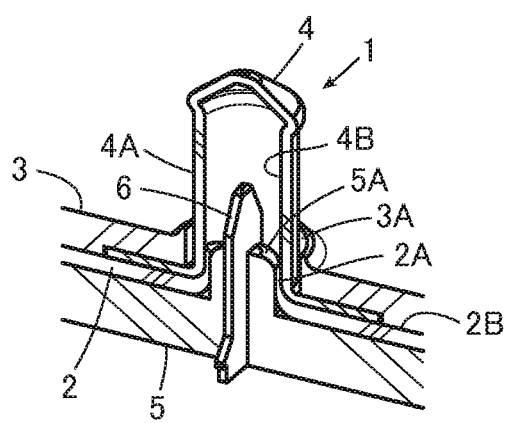
FIG. 19 is a cross-sectional perspective view showing a conventional connecting structure.

Instead of the pushing guide 61 constituted of a linear cut, as shown in FIG. 17, a pushing guide 62 constituted of a cut of cross shape penetrating the flexible substrate 11 from the top surface 11A through the bottom surface 11B may be formed in the flexible substrate 11 in advance, and alternatively, as shown in FIG. 18, a pushing guide 63 constituted of a hole penetrating the flexible substrate 11 from the top surface 11A through the bottom surface 11B may be formed in the flexible substrate 11 in advance.

With these configurations, similarly, the linking conductive member 31 is allowed to project inside the recessed portion 21C of the connection terminal 21 with less pushing power, and the presence of the pushing guides 62 and 63 clarifies the position to receive the linking conductive member 31 pushed from the bottom surface 11B side of the flexible substrate 11, thus improving the operability in formation of the connecting structure.

The flexible substrate 11 having one of the pushing guides 61 to 63 formed in advance may be used also in Embodiments 2 and 3 described above.

What is claimed is:

1. A method of electrically connecting a conductive connection terminal disposed on a top surface of a flexible substrate and including a recessed portion to a conductive portion exposed on a bottom surface of the flexible substrate, the method comprising:
   placing the connection terminal in such a manner that an opening end of the recessed portion of the connection terminal is in contact with the top surface of the flexible substrate;
   pushing a linking conductive member from a side of the bottom surface of the flexible substrate toward a side of the top surface of the flexible substrate on which the connection terminal is disposed, whereby the linking conductive member projects inside the recessed portion through the opening end of the recessed portion of the connection terminal as catching a part of the flexible substrate; and
   holding the part of the flexible substrate such that the part is sandwiched between a pressing portion of the linking conductive member and a first inner portion in the recessed portion of the connection terminal to thereby allow the pressing portion of the linking conductive member to make contact with the conductive portion exposed on the bottom surface of the flexible substrate and allow a contact portion of the linking conductive member to make contact with a second inner portion in the recessed portion of the connection terminal, whereby the connection terminal is electrically connected to the conductive portion of the flexible substrate via the linking conductive member.

2. The method according to claim 1,
   wherein when the linking conductive member is pushed from the side of the bottom surface of the flexible substrate toward the side of the top surface thereof, the flexible substrate is cut with a sharp portion disposed at a tip end of the linking conductive member, the linking conductive member is allowed to project inside the recessed portion of the connection terminal, and a cut edge of the flexible substrate cut with the sharp portion is sandwiched between the pressing portion of the linking conductive member and the first inner portion in the recessed portion of the connection terminal as the part of the flexible substrate.

3. The method according to claim 1,
   wherein the flexible substrate has a pushing guide that is formed in advance and is constituted of a cut or a hole penetrating the flexible substrate from the top surface to the bottom surface in a position where the opening end of the recessed portion of the connection terminal is situated, and
   wherein the linking conductive member is pushed from the side of the bottom surface of the flexible substrate toward the side of the top surface thereof through the pushing guide.

4. A connecting structure in which a conductive connection terminal disposed on a top surface of a flexible substrate and including a recessed portion is electrically connected to a conductive portion exposed on a bottom surface of the flexible substrate, the structure comprising:
   a linking conductive member including a pressing portion and a contact portion,
   wherein the connection terminal has a first inner portion and a second inner portion in the recessed portion,
   wherein with the connection terminal being disposed in such a manner that an opening end of the recessed portion of the connection terminal is in contact with the top surface of the flexible substrate, the linking conductive member projects inside the recessed portion from the side of the bottom surface of the flexible substrate through the opening end of the recessed portion of the connection terminal disposed on the top surface of the flexible substrate, and
   wherein a part of the flexible substrate is sandwiched between the pressing portion of the linking conductive member and the first inner portion of the connection terminal to thereby allow the pressing portion of the linking conductive member to make contact with the conductive portion exposed on the bottom surface of the flexible substrate and allow the contact portion of the linking conductive member to make contact with the second inner portion of the connection terminal, whereby the connection terminal is electrically connected to the conductive portion of the flexible substrate via the linking conductive member.

5. A connection terminal assembly comprising:
   a conductive connection terminal disposed on a top surface of a flexible substrate and including a recessed portion; and
   a linking conductive member including a pressing portion and a contact portion,
   wherein the connection terminal has a first inner portion and a second inner portion in the recessed portion,
   wherein with the connection terminal being disposed in such a manner that an opening end of the recessed portion of the connection terminal is in contact with the top surface of the flexible substrate, the linking conductive member projects inside the recessed portion from a side of a bottom surface of the flexible substrate through the opening end of the recessed portion of the connection terminal disposed on the top surface of the flexible substrate, and
   wherein a part of the flexible substrate is sandwiched between the pressing portion of the linking conductive member and the first inner portion of the connection terminal to thereby allow the pressing portion of the linking conductive member to make contact with a conductive portion exposed on the bottom surface of the flexible substrate and allow the contact portion of the linking conductive member to make contact with the second inner portion of the connection terminal, whereby the connection terminal is electrically connected to the conductive portion of the flexible substrate via the linking conductive member.

6. The connection terminal assembly according to claim 5,
wherein the linking conductive member has a fulcrum portion that is closer to a tip end of the linking conductive member than the pressing portion is,
wherein the connection terminal has a third inner portion in the recessed portion, and
wherein the pressing portion makes contact with the conductive portion of the flexible substrate, the contact portion makes contact with the second inner portion in the recessed portion of the connection terminal, and the fulcrum portion makes contact with the third inner portion in the recessed portion of the connection terminal, whereby the linking conductive member projecting inside the recessed portion of the connection terminal is held inside the recessed portion of the connection terminal.

7. The connection terminal assembly according to claim 6,
wherein the linking conductive member is formed from a band shaped metal sheet and includes a bottom portion bent in a U shape and a first arm and a second arm that extend in a same direction from the bottom portion,
wherein the first arm has a first projecting portion formed to project in a direction away from the second arm,
wherein the second arm has a second projecting portion formed to project in a direction away from the first arm,
wherein the pressing portion is formed from a part of the first arm between the bottom portion and the first projecting portion,
wherein the contact portion is formed from the second projecting portion, and
wherein the fulcrum portion is formed from the first projecting portion.

8. The connection terminal assembly according to claim 7,
wherein the linking conductive member includes a sharp portion disposed at a tip end of the first arm for cutting the flexible substrate.

9. The connection terminal assembly according to claim 7,
Wherein, in the linking conductive member, a distance L1 from the bottom portion to the pressing portion, a distance L2 from the bottom portion to the contact portion, and a distance L3 from the bottom portion to the fulcrum portion satisfy a relationship of L1<L2<L3.

10. The connection terminal assembly according to claim 6,
wherein the connection terminal has a tubular portion and a flange formed at one end of the tubular portion,
wherein the recessed portion is formed from an interior part of the tubular portion,
wherein the opening end is formed from the one end of the tubular portion,
wherein each of the first inner portion, the second inner portion and the third inner portion is disposed on an inner peripheral surface of the tubular portion, and
wherein the first inner portion and the third inner portion are opposed to the second inner portion.

11. The connection terminal assembly according to claim 6,
wherein the connection terminal is formed from a single metal sheet bent to have a pair of lateral sheets extending in parallel to each other, a top sheet interconnecting one ends of the pair of lateral sheets, and a pair of flanges extending from the other ends of the pair of lateral sheets in directions away from each other,
wherein the opening end is situated between the other ends of the pair of lateral sheets, and
wherein the first inner portion and the third inner portion are disposed on a surface of one of the pair of lateral sheets, while the second inner portion is disposed on a surface of the other of the pair of lateral sheets.

* * * * *